United States Patent
Wang et al.

(10) Patent No.: US 10,389,368 B1
(45) Date of Patent: Aug. 20, 2019

(54) DUAL PATH PHASE-LOCKED LOOP CIRCUIT

(71) Applicant: Cadence Design Systems, Inc., San Jose, CA (US)

(72) Inventors: Fuyue Wang, Shanghai (CN); Ling Chen, Shanghai (CN); Thomas Evan Wilson, Laurel, MD (US); Jianyun Zhang, Shanghai (CN); Eric Harris Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/943,491

(22) Filed: Apr. 2, 2018

(51) Int. Cl.
*H03L 7/06* (2006.01)
*H03L 7/089* (2006.01)
*H03L 7/093* (2006.01)
*H03L 7/099* (2006.01)

(52) U.S. Cl.
CPC .......... *H03L 7/0893* (2013.01); *H03L 7/0895* (2013.01); *H03L 7/093* (2013.01); *H03L 7/0992* (2013.01)

(58) Field of Classification Search
CPC ......... H03L 7/0891; H03L 7/18; H03L 7/093; H03L 7/087; H03L 7/10
USPC ....................................................... 327/156
See application file for complete search history.

(56) References Cited

U.S. PATENT DOCUMENTS

| | | | |
|---|---|---|---|
| 6,091,281 A | 7/2000 | Yoshida | |
| 6,999,745 B2 | 2/2006 | Leenaerts | |
| 7,212,051 B1* | 5/2007 | Zhu | H03L 7/0893 327/12 |
| 9,154,151 B1 | 10/2015 | Leong | |
| 2009/0115473 A1* | 5/2009 | Choi | H03L 7/0891 327/157 |
| 2011/0012652 A1* | 1/2011 | Lamanna | H03L 7/0893 327/156 |
| 2011/0156760 A1 | 6/2011 | Bhuiyan | |
| 2013/0257497 A1* | 10/2013 | Thelen | H03L 7/087 327/158 |

(Continued)

OTHER PUBLICATIONS

"U.S. Appl. No. 15/943,499, Examiner Interview Summary dated Jan. 15, 2019", 5 pgs.

(Continued)

*Primary Examiner* — Anh Q Tra
(74) *Attorney, Agent, or Firm* — Schwegman Lundberg & Woessner, P.A.

(57) ABSTRACT

Aspects of the present disclosure include a dual path phase locked loop (PLL) circuit with a switched capacitor filter topology along with systems, method, devices, and other circuits related thereto. The dual path PLL circuit includes an integral path and a proportional path. Both the integral path and proportional path include a charge pump and a loop filter. The outputs of a phase frequency detector (PFD) are sent to both charge pumps. The output of the integral path charge pump is connected to a capacitor, and the voltage on capacitor is used as the integral path control voltage for a voltage-controlled oscillator (VCO). A switched capacitor network is connected to the output of the proportional path charge pump and used to generate the proportional path control voltage for the VCO. Together, the two control voltages dictate the VCO's output frequency.

20 Claims, 6 Drawing Sheets

(56) References Cited

U.S. PATENT DOCUMENTS

2014/0159776 A1    6/2014    Elran

OTHER PUBLICATIONS

"U.S. Appl. No. 15/943,487, Notice of Allowance dated Sep. 26, 2018", 9 pgs.
"U.S. Appl. No. 15/943,499, Non Final Office Action dated Oct. 22, 2018", 8 pgs.
"U.S. Appl. No. 15/943,499, Response filed Jan. 22, 2019 to Non Final Office Action dated Oct. 22, 2018", 10 pgs.
U.S. Appl. No. 15/943,499, Notice of Allowance dated Mar. 28, 2019, 8 pgs.
U.S. Appl. No. 15/943,487, U.S. Pat. No. 10,161,974, filed Apr. 2, 2018, Frequency to Current Circuit.
U.S. Appl. No. 15/943,499, filed Apr. 2, 2018, Fast Settling Bias Circuit.

* cited by examiner

DUAL PATH PHASE-LOCKED LOOP CIRCUIT

TECHNICAL FIELD

The present disclosure generally relates to integrated circuit (IC) design. In particular, the present disclosure addresses a dual path phase lock loop circuit design.

BACKGROUND

Phase-locked loop (PLL) circuits are widely used in numerous applications such as I/O interfaces, digital integrated circuits, memory systems, processors, frequency multiplication, or frequency tracking. A typical PLL circuit includes a phase frequency detector (PFD), a charge pump (charge pump), a loop filter (LF), a voltage controlled oscillator (VCO), and a frequency divider circuit. The PFD compares the phase of the reference signal and the feedback signal from the frequency divider circuit. Depending on the relationship of the phase of the reference signal and the feedback signal, the PFD provides one or more signals to the charge pump that instruct the charge pump to increase or decrease the voltage to the VCO through the LF. The LF may integrate the signal to smooth it, and the LF provides the smoothed signal to the VCO. The frequency of the VCO increases or decreases depending on the voltage signal from the LF. The output of the VCO is fed back to the PFD through the frequency divider in a loop that causes the output signal of the VCO to have a frequency that is proportional to (or equal to) and in phase with the reference signal.

In conventional PLL circuit design, the low pass filter generally consists of an integral capacitor and a series resistor in order to maintain loop stability. The resistor provides a zero (e.g., the zero of the low pass filter) that improves the PLL loop stability, but generates a ripple on the control voltage if the charge pump is unable to ideally match. To address this issue, a second small capacitor is typically used in parallel with the integral capacitor and series resistor to filter the ripple. However, the second capacitor may degrade the PLL's phase margin. Thus, in the conventional PLL circuit design, there is a trade-off between stability and jitter.

In addition to the challenge described above, another challenge for conventional PLL circuits is the rapid reduction in core voltage in the semiconductor process development. The rapid reduction in core voltage greatly increases the design difficulty of the charge pump. For example, the power supply for 28 nm semiconductors is around 1.0V and for Fin Field-effect transistor (FinFET) processes, the power supply is lower than 0.8V. Hence, it may be difficult to keep the charge pump current match in the control voltage range with such a low power supply voltage.

Another challenge encountered with conventional PLL design is that, in some applications, the reference frequency may change widely (e.g., from Mega Hz to Giga Hz), which means the PLL must be able to adjust its parameters adaptively to fit the bandwidth and meet stability standards as well.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure include a dual path PLL circuit with a switched capacitor filter topology along with systems, method, devices, and other circuits related thereto. The dual path PLL circuit includes an integral path and a proportional path. Both the integral path and proportional path include a charge pump and a loop filter. The outputs of a PFD are sent to both charge pumps. The output of the integral path charge pump is connected to a capacitor, and the voltage on capacitor is used as the integral path control voltage for a VCO. Unlike some known dual path PLL circuits where voltage on a resistor and capacitor connected to the output of the proportional path charge pump is used as the proportional path control voltage, a switched capacitor network is connected to the output of the proportional path charge pump and used to generate the proportional path control voltage for the VCO. Together, the two control voltages dictate the VCO's output frequency.

By splitting the charge pump function into two blocks, the integral path can provide a particular rail-rail tuning range by relaxing speed requirements, and the proportional path only needs to provide a relative small voltage tuning range, thereby simplifying the charge pump design. Additionally, the dual path PLL with a switched capacitor filter topology can also help to improve the jitter performance of the circuit by using a high gain coefficient for the integral path to get a wide frequency tuning range while keeping a low gain coefficient for the proportional path to optimize the jitter.

Figure 1:
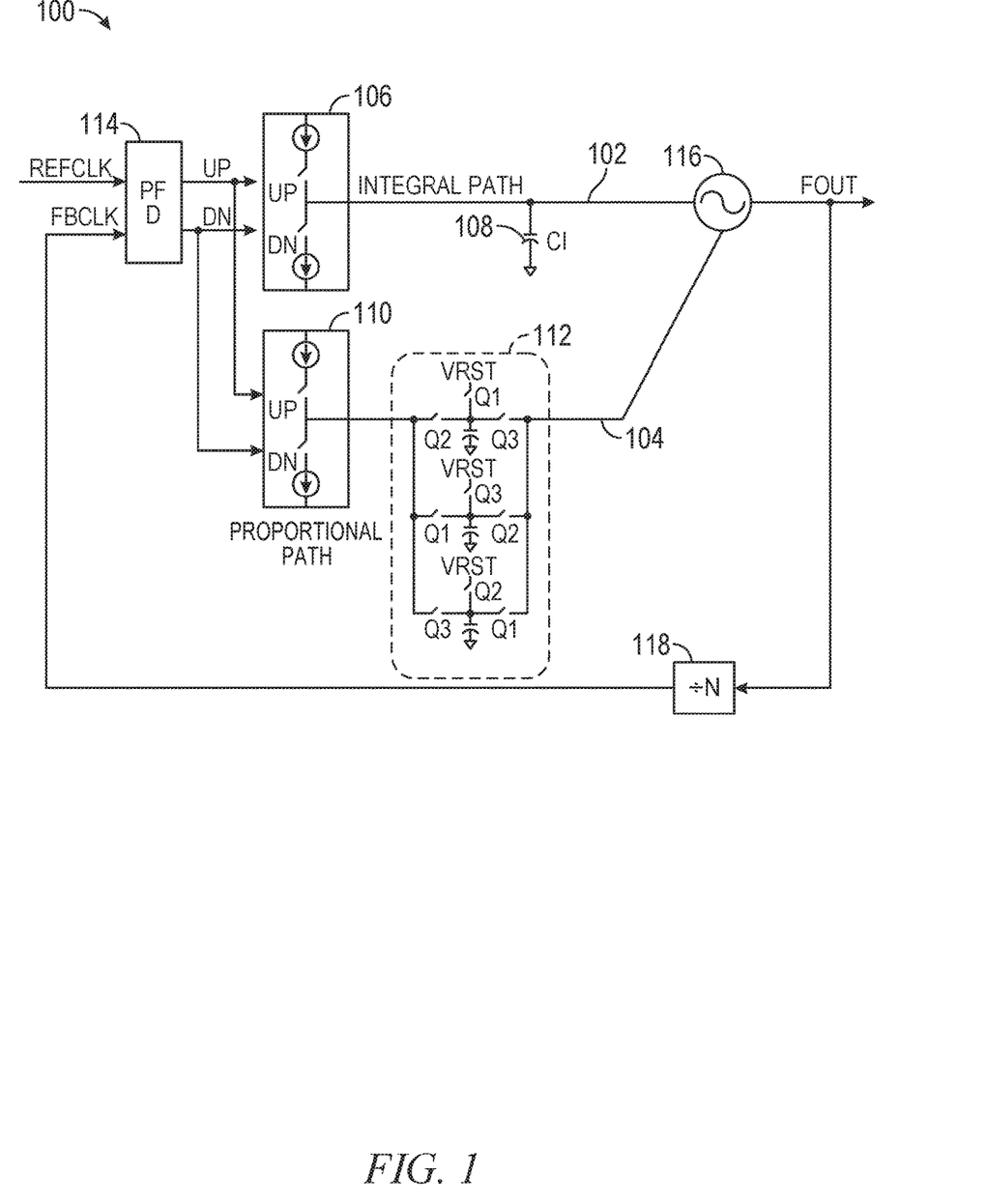
FIG. 1 is a circuit diagram illustrating a dual path PLL circuit with a switched capacitor filter topology, according to some example embodiments.

FIG. 1 is a circuit diagram illustrating a dual path PLL circuit 100 with a switched capacitor filter topology, according to some example embodiments. The dual path PLL circuit 100 includes two dual paths—an integral path 102 and a proportional path 104. The integral path 102 includes a charge pump 106, and the output of the charge pump 106 is connected to a loop filter 108. As shown, the loop filter 108 comprises an integral capacitor. The proportional path 104 includes a charge pump 110, and the output of the charge pump 110 is connected to a switched capacitor network 112 that acts as the proportional path loop filter. Together, the integral path 102 and the proportional path 104 provide a dual path control voltage to a VCO 116.

The charge pumps 106 and 110 receive signals output by a PFD 114. At its inputs, the PFD 114 is connected to a reference clock, from which the PFD 114 receives a reference clock signal refclk, and a frequency divider 118, from which the PFD receives a feedback clock signal fbclk. The PFD 114 provides an output signal to the charge pumps 106 and 110 that is proportional to a phase difference between the reference clock signal refclk and the feedback clock signal fbclk. More specifically, the charge pumps 106 and 110 each receive "up" and "down" signals from the PFD 114.

The charge pump 106 in the integral path 102 provides current to the loop filter 108 to generate the integral path 102 control voltage to the VCO 116. The charge pump 110 provides current to the switched capacitor network 112 to generate the proportional path 104 control voltage for the VCO 116. Together, the integral path 102 control voltage and the proportional path 104 control voltage dictate the voltage output by the VCO 116.

The VCO 116 provides an oscillating output signal responsive to the dual path control voltage. The output of the VCO 116 is connected to a frequency divider 118 that generates the feedback clock signal fbclk based on the oscillating output signal from the VCO 116. More specifically, the frequency divider 118 feeds back the output signal of the VCO 116 as the feedback clock signal fbclk to the PFD 114 in a loop that causes the output signal of the VCO 116 to have a frequency that is proportional to and in phase with the reference signal refclk.

Figure 2:
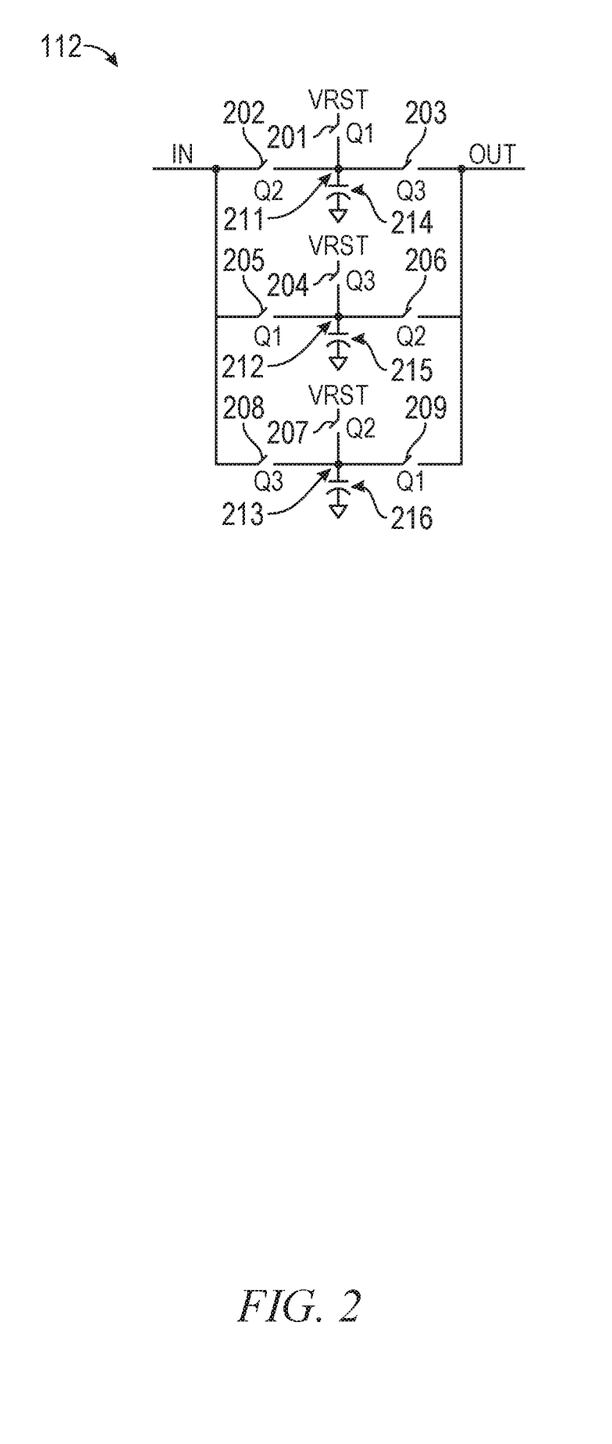
FIG. 2 is a circuit diagram illustrating further details of a switched capacitor network, which is included as part of the dual path PLL circuit illustrated in FIG. 1, according to some example embodiments.

FIG. 2 is a circuit diagram illustrating further details of the switched capacitor network 112 of the dual path PLL circuit 100, according to some example embodiments. As shown, the switched capacitor network 112 comprises three branches, and the inputs and the outputs of the branches are tied together. The inputs of the branches are tied to net "in" while the outputs for the branches are tied to net "out." Net "in" is the input of the switched capacitor network 112, which is connected to the output of the proportional path 104 of charge pump 110. Net "out" is the output of the switched capacitor network 112, which is connected to the VCO 116 and corresponds to the proportional path 104 control voltage provided thereto.

Each branch of the switched capacitor network 112 comprises three switches and a capacitor. More specifically, in the top branch of the switched capacitor network 112, switch 201 is connected between a reset voltage VRST and net 211 and is controlled by a clock signal q1; switch 202 is connected between the "in" net and the net 211 and is controlled by a clock signal q2; switch 203 is connected between the "out" net and net 211 and is controlled by a clock signal q3; capacitor 214 is connected between the net 211 and ground. In the middle branch of the switched capacitor network 112, switch 204 is connected between a reset voltage VRST and net 212 and is controlled by the clock signal q3; switch 205 is connected between the "in" net and the net 212 and is controlled by the clock signal q1; switch 206 is connected between the "out" net and the net 212 and is controlled by a clock signal q2; capacitor 215 is connected between the net 212 and ground. In the bottom branch of the switched capacitor network 112, switch 207 is connected between a reset voltage VRST and net 213 and is controlled by a clock signal q2; switch 208 is connected between the "in" net and net 213 and is controlled by a clock signal q3; switch 209 is connected between the "out" net and net 213 and is controlled by a clock signal q1; capacitor 216 is connected between the net 213 and ground. As shown, the components and connections of each branch are the same, but the control clock signal is shifted one phase at each branch.

The operation of the switched capacitor network 112 is as follows: when clock signal q1 is high, clock signals q2 and q3 are low, and the net 211 is reset by the switch 201 to the reset voltage VRST. When clock signal q2 is high, clock signals q1 and q3 are low, and the switch 202 is closed, thereby connecting the capacitor 214 to the proportional path 104 of charge pump 110. Further, when clock signal q2 is high, the voltage on net 211 increases or decreases according to the signals at the up and down signals from the PFD 114. When clock signal q3 is high, clock signals q1 and q2 are low, the switch 203 is closed, and the final voltage of the net 211 at the end of the clock signal q2 phase is provided to the "out" net. Since the control clock signals for the branches of the switched capacitor network 112 are shifted one phase, when the top branch is reset, the middle branch samples the output of the charge pump 110, and the bottom branch sends out the previous sample.

Figure 3:
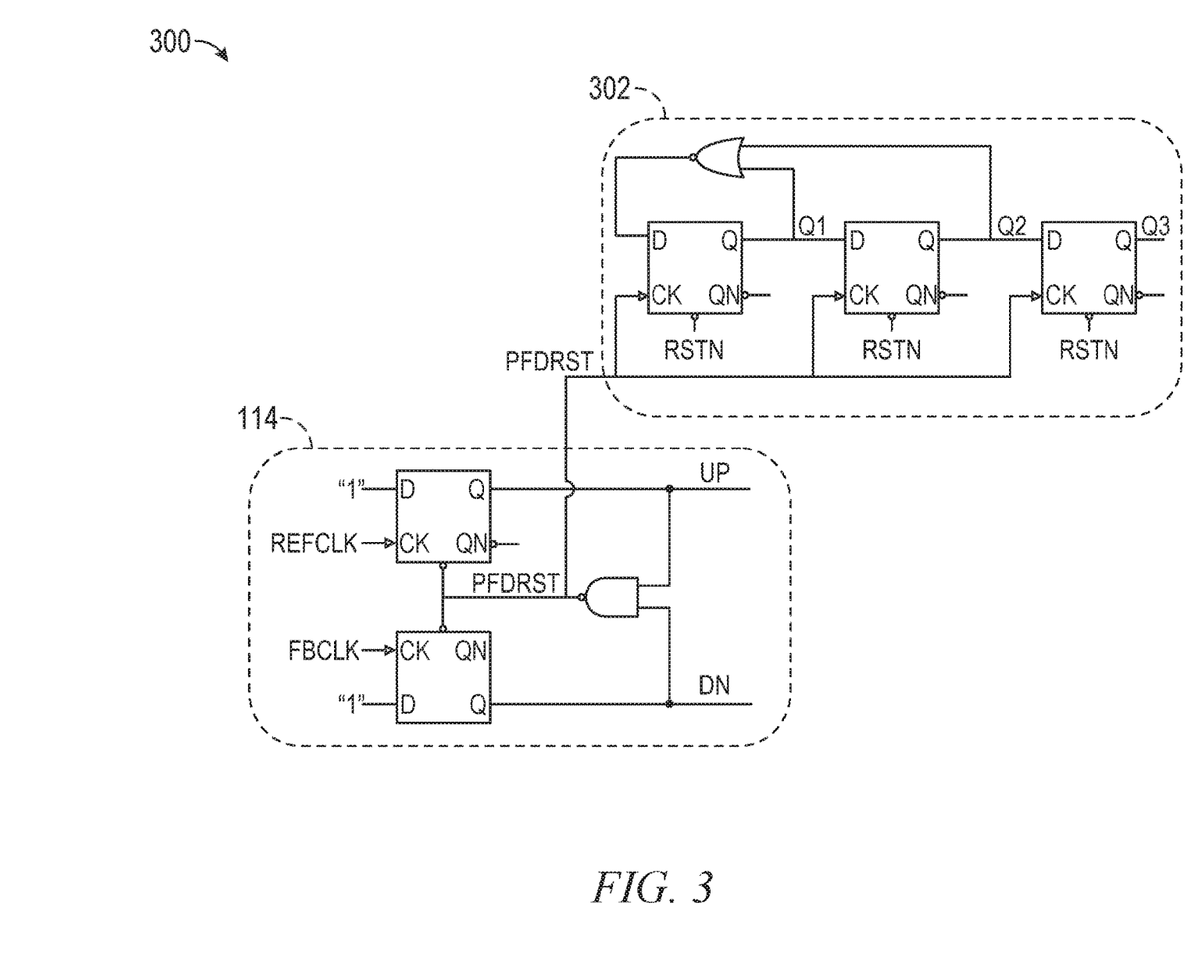
FIG. 3 is a circuit diagram illustrating a circuit configured to produce control clock signals for the dual path PLL circuit, according to some example embodiments.

The control clock signals q1, q2, and q3 may have specific timing relationships with the up and down signals from the PFD 114. As an example, FIG. 3 is a circuit diagram illustrating a circuit 300 configured to produce the up and down signals for the dual path PLL circuit 100 based on the clock signals q1, q2, and q3, according to some example embodiments. The circuit 300 comprises the PFD 114 and a frequency divider 302 with a divider ratio of three. A PFD reset signal pfdrst is used as the controlling clock signal for the frequency divider 302. As noted above, the PFD 114 receives a reference signal refclk and a feedback signal fbclk as inputs, and provides up and down signals as output. At the positive edge of the reference signal refclk, the up signal is set to "1." At the positive edge of the feedback signal fbclk, the down signal is set to "1." As shown, the PFD reset signal pfdrst is generated by passing the up and down signals through a NAND gate, and thus, the PFD reset signal pfdrst is set to "1" until both the up and down signals are "1" at which point the PFD reset signal pfdrst is set to "0."

Figure 4:
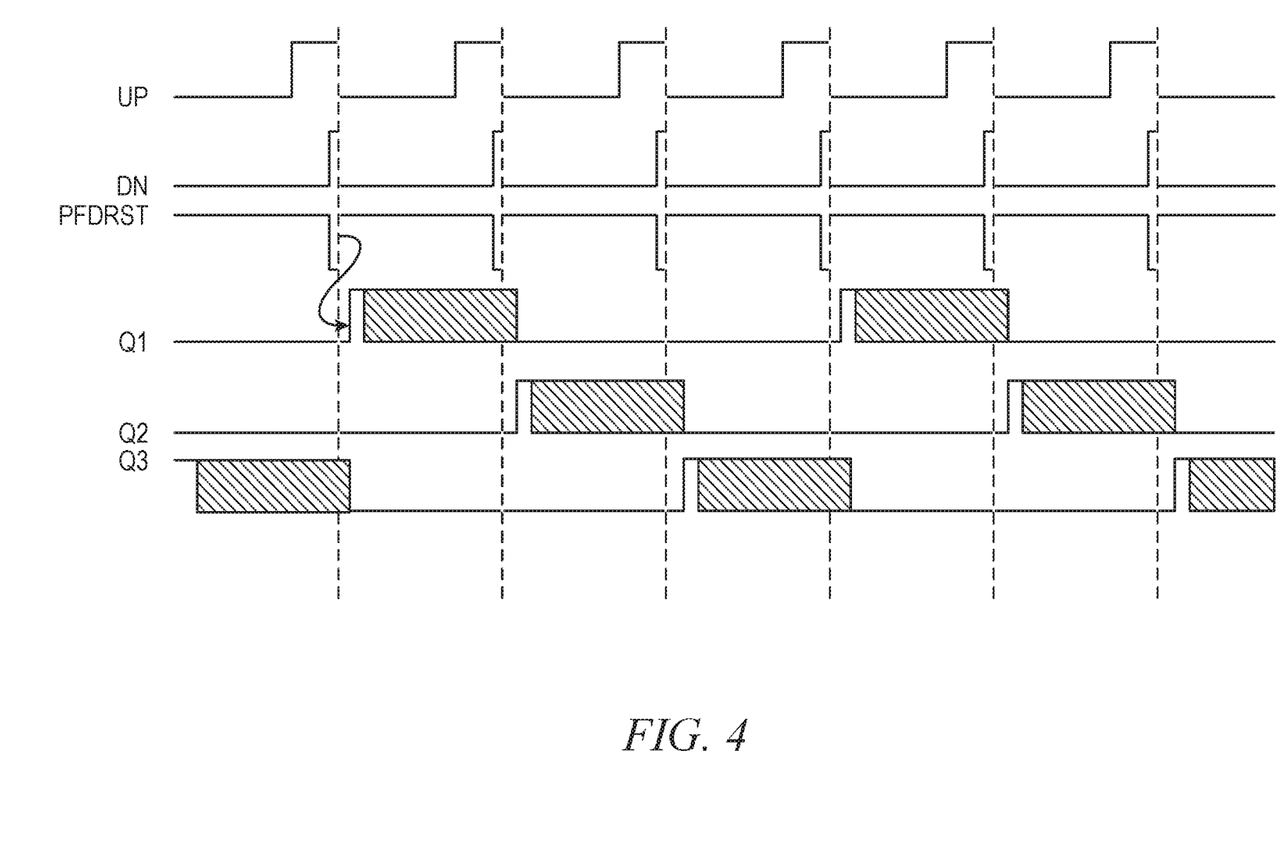
FIG. 4 is a timing diagram illustrating various input and output signals of the dual path PLL circuit illustrated in FIG. 1, according to some example embodiments.

FIG. 4 is a timing diagram that illustrates the up, down, pfdrst, q1, q2, q3 signals of the dual path PLL circuit 100, according to some example embodiments. As shown, if both the up and down signals are set to "1," the PFD reset signal pfdrst is set to "0" and the up and down signals are reset to "0" by the PFD reset signal pfdrst. The frequency divider 304 is triggered at the positive edge of the PFD reset signal pfdrst, and the clock signals q1, q2, q3 are output by the frequency divider 304.

It shall be appreciated that the switched capacitor network 112 provides a number of benefits to the dual path PLL circuit 100 when compared to a traditional PLL circuit. For example, at locked state, the control voltage at the proportional path 104 is approximately the reset voltage vrst, which may, for example, be set at one half the supply voltage Vdd to simplify the charge pump 110 design. As another example of the benefits provided by the switched capacitor network 112, with the reset, sample, and hold phase, the ripple on the proportional path 104 may be removed, thereby improving the jitter performance. As yet another example of the benefits provided by the switched capacitor network 112, because three phases are used in the switched capacitor network 112, and the reset phase can be extended to one cycle of the PFD 114, the switched capacitor network 112 supports a high frequency PFD 114 (e.g., up to GHz for 28 nm or 16 nm FinFet process).

Figure 5:
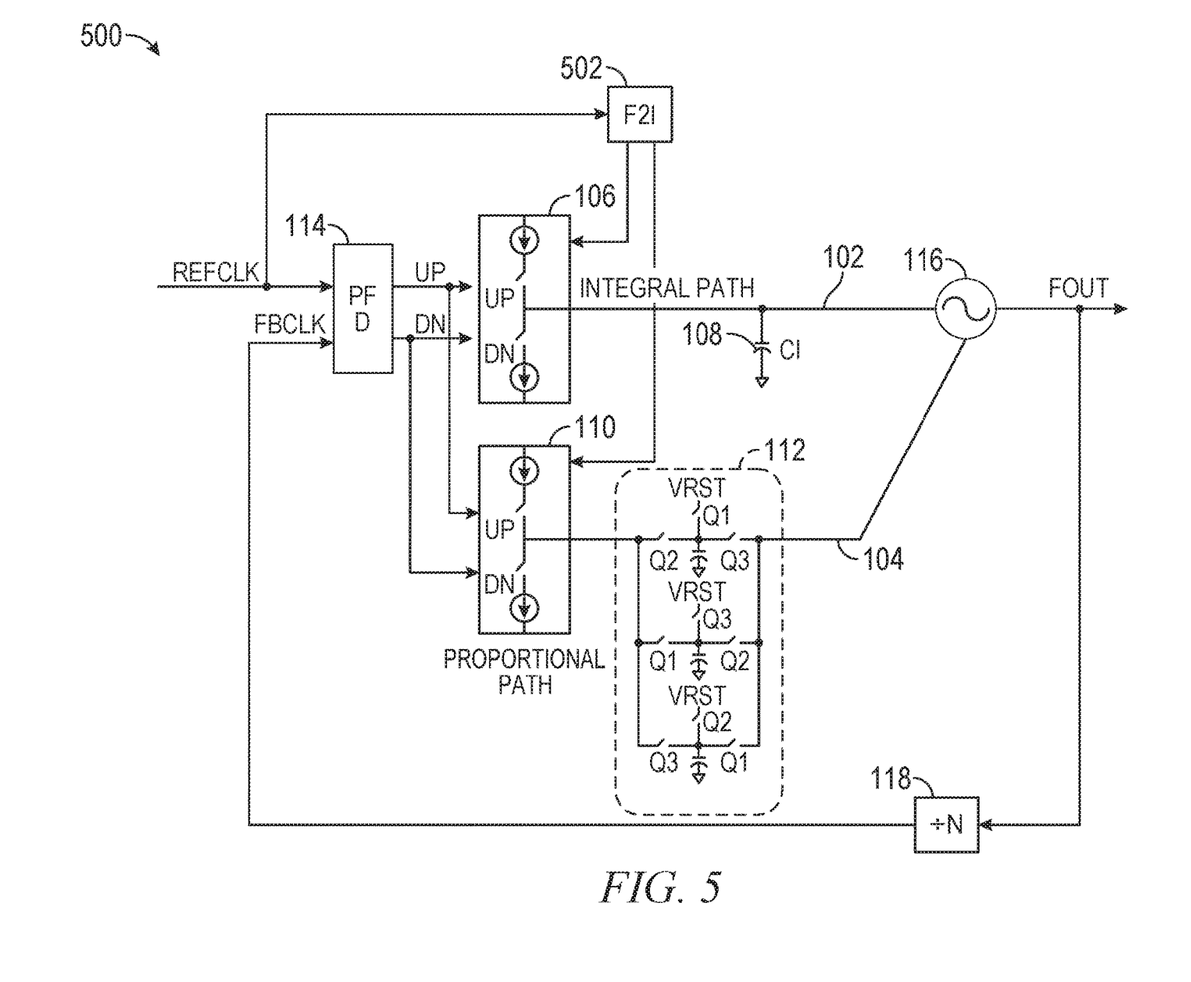
FIG. 5 is a circuit diagram illustrating a dual path adaptive bandwidth PLL circuit with a switched capacitor filter topology, according to some example embodiments.

As still another example of the benefits provided by the switched capacitor network 112, the switched capacitor network 112 may act as an equivalent to a resistor (e.g., with an equivalent resistance of Req=1/($C_p$*$F_{pfd}$), where $C_p$ is the capacitance of switched capacitor network 112 and $F_{pfd}$ is the frequency of the PFD 114), and since the equivalent resistance is proportional to the working frequency of the PFD 114, the dual path PLL circuit 100 can be easily modified to be an adaptive bandwidth PLL. For example, as illustrated in FIG. 5, a frequency-to-current (F2I) converter circuit 502 may be added to the dual path PLL circuit 100 to create a dual path adaptive bandwidth PLL circuit 500, according to some example embodiments.

In the context of the dual path adaptive bandwidth PLL circuit 500, the F2I circuit 502 generates a charge pump current that is proportional to the frequency of the reference clock signal refclk provided to the PFD 114. Thus, with the addition of the F2I circuit 502, the proportional path 104 charge pump current and the integral path 102 charge pump current change with the frequency of the reference clock signal refclk.

Figure 6:
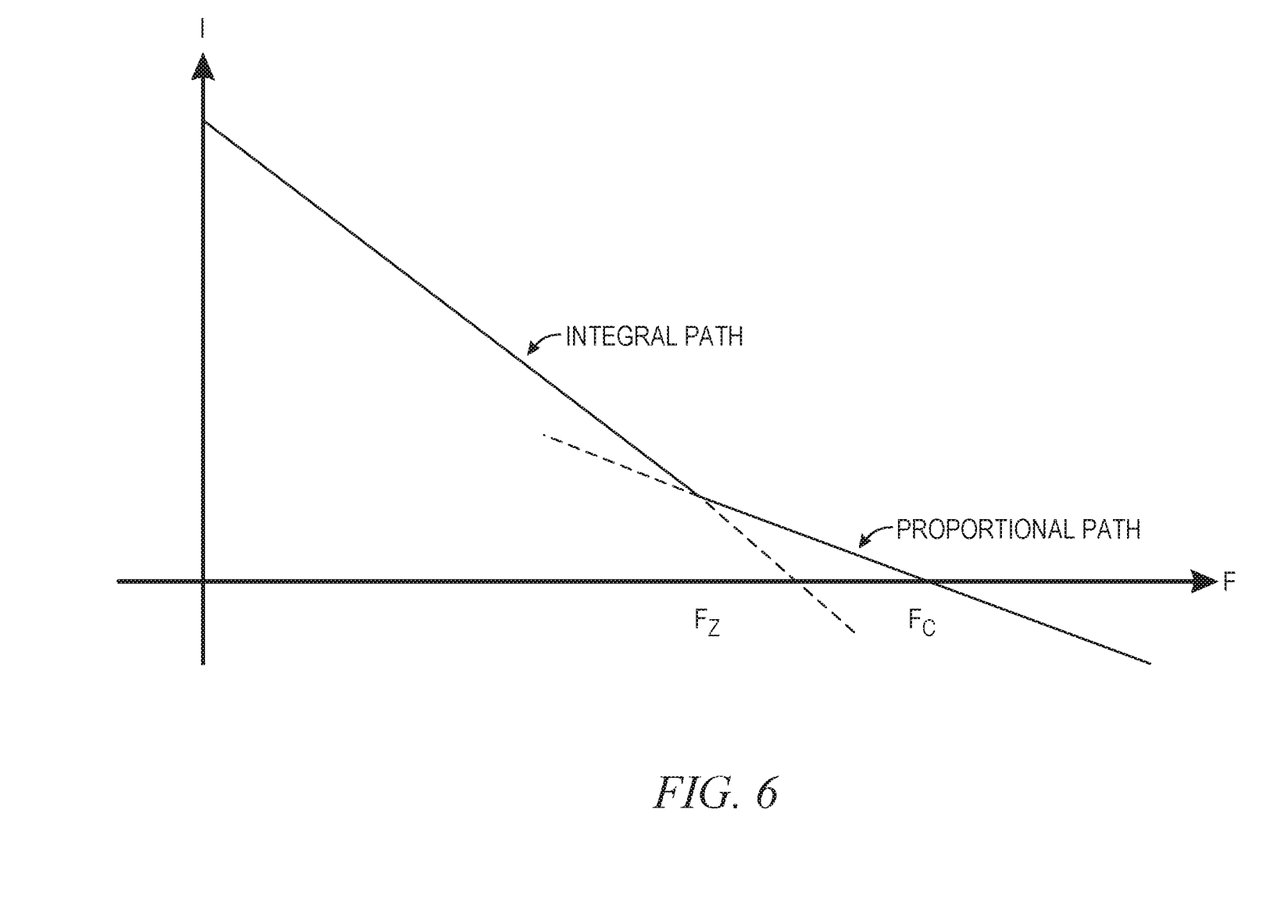
FIG. 6 is a graph illustrating an alternating current (AC) amplitude frequency response of the dual path PLL circuit in accordance with the timing diagram illustrated in FIG. 5, according to some example embodiments.

FIG. 6 is a graph illustrating the alternating current (AC) amplitude frequency response of the dual path PLL circuit 100, in accordance with the timing diagram illustrated in FIG. 5, according to some example embodiments. In the context of the frequency response of the dual path PLL circuit 100, the cross frequency $F_C$ and the zero frequency $F_Z$ of the open loop transfer function are as follows:

$$F_c = \frac{1}{2\pi} \frac{I_p \cdot K_p}{F_{pfd} \cdot C_p} \frac{1}{N}$$

$$F_z = \frac{1}{2\pi} \frac{I_i}{I_p} \frac{K_i}{K_p} \frac{C_p}{C_i} F_{pfd}$$

where $I_p$ is the charge pump current for proportional path 104, $I_i$ is the charge pump current for the integral path 102, $K_p$ is the proportional path 104 VCO 116 gain, $K_i$ is the integral path 102 VCO 116 gain, $C_p$ is the capacitance of capacitors 214-216, $C_i$ is the capacitance of the loop filter 108, and $F_{pfd}$ is the frequency of the PFD 114. If the VCO 116 is implemented using a simple ring VCO with a gain that is approximately linearly proportional to the oscillation frequency of the VCO 116, then the ratio of the cross frequency $F_C$ to the frequency of the PFD 114 $F_{pfd}$ ($F_C/F_{pfd}$) as well as the ratio of the zero frequency $F_Z$ to the frequency of the PFD 114 $F_{pfd}$ ($F_Z/F_{pfd}$) are both constant without impacting the frequency of the PFD 114 or the feedback divider ratio. Thus, the dual path PLL circuit 100 may have an adaptive bandwidth property without using any programmable devices or circuits.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A phase locked loop (PLL) circuit comprising:
   a phase frequency detector (PFD) having two PFD inputs, a first PFD input receiving a feedback clock signal, a second PFD input receiving a reference clock signal, the PFD providing PFD output signals that are proportional to a phase difference between the reference clock signal and the feedback clock signal;
   an integral path connected to the PFD, the integral path comprising an integral path charge pump connected to an integral path loop filter, the integral path providing an integral path control voltage based on the PFD output signals;
   a proportional path connected to the PFD, the integral path comprising a proportional path charge pump connected to a proportional path loop filter, the proportional path loop filter comprising a switched capacitor network, the switched capacitor network providing a proportional path control voltage based on the PFD output signals, the switched capacitor network comprising:
      a switched capacitor network input connected to the proportional path charge pump;
      a switched capacitor network output connected to the VCO, the proportional path control voltage being provided at the switched capacitor network output; and
      three branches connected between the switched capacitor network input and output, an input of each branch being tied to a first net corresponding to the switched capacitor network input, an output of each branch being tied to a second net corresponding to the switched capacitor network output;

a voltage controlled oscillator (VCO) having two VCO inputs, a first VCO input being connected to the integral path and receiving the integral path control voltage, a second VCO input being connected to the proportional path and receiving the proportional path control voltage, the VCO providing an oscillating output signal responsive to the integral path control voltage and the proportional path control voltage; and a frequency divider connected to the VCO, the feedback divider to receive the oscillating output signal from the VCO and to generate the feedback clock signal based on the oscillating output signal, the feedback clock signal having a frequency that is proportional to and in phase with the reference signal.

2. The PLL circuit of claim 1, wherein each branch of the three branches comprises three switches and a capacitor, each capacitor having equal capacitance.

3. The PLL circuit of claim 2, wherein three phase clocks control operation of the three switches in each branch, the three phase clocks controlling the phase clocks such that two switches are open when one switch is closed.

4. The PLL circuit of claim 1, wherein each branch of the three branches comprises:

a first switch connected between a reset signal and a third net;

a second switch connected between the first net and the third net;

a third switch connected between the third net and the second net; and a capacitor of each branch between the third net and ground.

5. The PLL circuit of claim 4, wherein three phase clocks control operation of the three switches in each branch, the three phase clocks controlling the three switches such that, when the first switch in a first branch is closed, the second switch in the second branch and the third switch in the third branch are closed and the remaining switches are open.

6. The PLL circuit of claim 5, further comprising an additional frequency divider circuit connected to the PFD, the additional frequency divider circuit configured to generate the three phase clock signals responsive to a control signal generated using the PFD output signals.

7. The PLL circuit of claim 1, wherein the integral path loop filter comprises an integral capacitor.

8. The PLL circuit of claim 1, wherein the proportional path charge pump is driven by the PFD output signals; and
wherein the proportional path charge pump provides a proportional path charge pump output signal to the proportional path loop filter.

9. The PLL circuit of claim 1, wherein the integral path charge pump is driven by the PFD output signals; and
wherein the integral path charge pump provides an integral path charge pump output signal to the integral path loop filter.

10. A method comprising:

receiving, at a phase frequency detector (PFD), a reference clock signal and a feedback clock signal;

generating, by the PFD, one or more PFD output signals that are proportional to the reference clock signal and the feedback clock signal;

generating a dual path control voltage based on the PFD output signals, the dual path control voltage comprising a proportional path voltage generated by a switched capacitor network, the generating of the dual path control voltage comprising generating one or more clock signals to cause the switched capacitor network to generate the proportional path voltage, the generating of the one or more clock signals includes using the PFD output signals to generate a control signal for a first frequency divider, the first frequency divider having a divider ratio that is equal to a number of the one or more clock signals;

generating, at a voltage controlled oscillator (VCO), an oscillating signal responsive to the dual path control voltage; and generating, by a second frequency divider, the feedback clock signal using the oscillating signal, the feedback clock signal having a frequency that is proportional to and in phase with the reference clock signal.

11. The method of claim 10, wherein the dual path voltage further comprises an integral path control voltage.

12. The method of claim 11, wherein the proportional path voltage is generated by the switched capacitor network based on output provided by a proportional path charge pump controlled by the PFD output signals.

13. An adaptive bandwidth phase locked loop (PLL) circuit comprising:

a dual path connected to a phase frequency detector (PFD) output, the dual path comprising an integral path and a proportional path, the integral path comprising an integral path charge pump connected to an integral path loop filter, the integral path providing an integral path control voltage based on one or more PFD output signals, the PFD output signals being proportional to a reference clock signal and a feedback clock signal, the proportional path comprising a proportional path charge pump and a switched capacitor network, the switched capacitor network providing a proportional path control voltage based on the PFD output signals, the integral path control voltage and the proportional path control voltage forming a dual path control voltage, the switched capacitor network comprising:

a switched capacitor network input connected to the proportional path charge pump;

a switched capacitor network output connected to the VCO, the proportional path control voltage being provided at the switched capacitor network output; and three branches connected between the switched capacitor network input and output, an input of each branch being tied to a first net corresponding to the switched capacitor network input, an output of each, a voltage controlled oscillator (VCO) connected to the dual path, the VCO providing an oscillating output signal responsive to the dual path control voltage;

a frequency divider connected to the VCO, the feedback divider to receive the oscillating output signal from the VCO and to generate the feedback clock signal based on the oscillating output signal, the feedback clock signal having a frequency that is proportional to and in phase with the reference signal; and a frequency to current converter connected to the proportional and integral path charge pumps, the frequency to current converter configured to provide charge pump current to the proportional and integral path charge pumps that is proportional to a frequency of the reference clock signal.

14. The adaptive bandwidth PLL circuit of claim 13, wherein each branch of the three branches comprises:

a first switch connected between a reset signal and a third net;

a second switch connected between the first net and the third net;

a third switch connected between the third net and the second net; and a capacitor of each branch between the third net and ground.

15. The adaptive bandwidth PLL circuit of claim 14, wherein three phase clocks control operation of the three switches in each branch, the three phase clocks controlling the three switches such that, when the first switch in a first branch is closed, the second switch in the second branch and the third switch in the third branch are closed and the remaining switches are open.

16. The adaptive bandwidth PLL circuit of claim 15, further comprising an additional frequency divider circuit connected to the PFD, the additional frequency divider circuit configured to generate the three phase clock signals responsive to a control signal generated using the PFD output signals.

17. The adaptive bandwidth PLL circuit of claim 13, wherein each branch of the three branches comprises three switches and a capacitor, each capacitor having equal capacitance.

18. The adaptive bandwidth PLL circuit of claim 17, wherein three phase clocks control operation of the three switches in each branch, the three phase clocks controlling the phase clocks such that two switches are open when one switch is closed.

19. The adaptive bandwidth PLL circuit of claim 13, wherein the proportional path charge pump is driven by the PFD output signals; and wherein the proportional path charge pump provides a proportional path charge pump output signal to the proportional path loop filter.

20. The adaptive bandwidth PLL circuit of claim 13, wherein the integral path charge pump is driven by the PFD output signals; and wherein the integral path charge pump provides an integral path charge pump output signal to the integral path loop filter.

* * * * *